STABLE CURRENT REFERENCE CIRCUIT WITH BETA COMPENSATION

Filed May 30, 1972

United States Patent Office 3,721,893

Patented Mar. 20, 1973

3,721,893

STABLE CURRENT REFERENCE CIRCUIT WITH BETA COMPENSATION

William F. Davis, Tempe, Ariz., assignor to Motorola, Inc., Franklin Park, Ill.

Filed May 30, 1972, Ser. No. 257,695
Int. Cl. G05f *1/58;* H03k *1/12*
U.S. Cl. 323—4 10 Claims

ABSTRACT OF THE DISCLOSURE

A monolithic integrated current reference system utilizes a single stable reference current source for controlling the operation currents of circuits formed as part of the integrated circuit. Variations of such operating currents with temperature due to variations in the beta of the transistors used in the system are compensated for by providing additional beta dependent current components to the system.

BACKGROUND OF THE INVENTION

In monolithic integrated circuits, it is desirable to provide temperature and voltage compensated current sources to supply operating currents for the various components on the integrated circuit. To minimize the area of the chip which is used for such stabilized current sources, it generally is desirable to utilize a single regulated and compensated stable current source as a reference current source. The current from such a stable current source then is used to establish the operating currents or "mirror" currents for various other portions of the circuit. This may be accomplished by supplying the stabilized current through a transistor diode, with the collector-base node of such a transistor diode being coupled to the base of a further current source transistor for another portion of the circuit.

When the emitters of the transistor diode and the further current source transistor are coupled to the same reference point or voltage supply terminal, the emitter current of the further current source transistor is a function of the emitter area scaling of the transistor diode and such further current source transistor. If this area scaling is such that the two transistors have equal emitter areas, equal emitter current flows in both transistors.

The collector current of the further current source transistor, however, is not the same as the current supplied by the stabilized current source to the collector of the transistor diode, because of the base current which flows from the node of the base-collector junction of the transistor diode into the base of the further current source transistor. As a consequence, the collector current of the further current source transistor is equal to the stabilized reference current minus twice the base current of either transistor. This base current is a function of the beta parameter of the transistor and changes considerably with temperature. Thus, even though a stabilized reference current is used to bias a reference transistor diode, the emitter current of both the transistor diode and the further current source transistors in the circuit have a base current dependence. Further, there is a variation in the collector current of these further current source transistors with temperature due to variations in the beta of these transistors. In many electronic systems, such as many automotive electronic systems, a limited supply voltage is available. If the further current source is used for example, in a fuel injection system to alternately discharge two capacitors at exactly the same rate, it is important to linearly discharge each capacitor identically to the lowest possible voltage for the maximum dynamic range obtainable from the available supply voltage. By appropriately biasing and connecting the emitters of two transistors to the collector of the further current source transistor, a very high collector impedance for the inserted transistors is realized. As a result, this technique can linearly discharge two capacitors alternately very precisely to about one volt. The discharge current, however, contains base current terms which introduce a significant temperature-dependent current error into the discharge circuit. This must be eliminated.

Circuits for eliminating beta current errors from the currents, supplied to utilization circuits by reference current transistors controlled by a stabilized current source are generally known. However, the capability to alternately discharge two capacitors identically and linearly to a voltage of one volt and to maintain this identity and linearity better than $\pm 11\%$ over a wide range of ambient temperature variations has not been possible in a practical circuit fabricated in monolithic integrated circuit technology.

SUMMARY OF THE INVENTION

Accordingly, it is an object of this invention to provide an improved circuit capable of providing a stable output current corresponding to a reference current.

It is a further object of this invention to alternately switch substantially identical currents from one branch to another.

It is an additional object of this invention to compensate for base current (beta) variations in a transistorized circuit supplying current to a utilization circuit.

It is yet another object of this invention to switch identical currents alternately between two branches of a circuit, with both of the switched currents being referenced to the same current source.

It is still another object of this invention to supply temperature independent current to a utilization circuit.

In accordance with a preferred embodiment of this invention, a circuit capable of providing two alternately switched stable output currents corresponding to a reference current includes a reference current source which may be voltage and temperature stabilized. This reference current source is connected in series with the collector-emitter path of a pair of transistors of the same conductivity type between first and second voltage supply terminals. A third transistor has its base coupled to the junction of the collector of the first transistor and the reference current source and its emitter connected to the base of the first transistor. The collector of the third transistor is connected to the first voltage supply terminal. The third terminal supplies the base current for the first transistor, so that the emitter current of the first transistor is equal to the current from the current source plus the third transistor (this neglects the base current of the third transistor since it is insignificant). This added current then is supplied to the collector of the second transistor. The base of the second transistor and the base of a further current source transistor to be controlled by the reference current source are provided with operating current obtained from a fourth transistor at a common node, and the emitters of the second transistor and the further current source transistor are connected to the second voltage supply terminal. The collector of the fourth transistor is connected to the first supply terminal and the base current to the fourth transistor is also supplied by the third transistor. This causes the emitter current of the fourth transistor to be equal to the sum of the base current of the second transistor and the further current source transistor. Because of the added base current component which is injected into the collector current of the second transistor, the collector current of the further current source transistor also includes this component. This compensates or eliminates the base current component added by a cascaded switching transistor, the collector-emitter path of which is connected in series with the collector of the further current source transistor. This added base current component is supplied by signals connected to the base of the switching transistor, so that the current on the collector of the switching transistor corresponds to the current of the reference current source.

In a more specific embodiment of this invention, the cascaded switching transistor may be in the form of a differential pair of switching transistors, each having the emitters connected together in common to the collector of the further current source transistor. Identical currents (differing only by the insignificant difference in base current of the transistors of the differential pair) then can be alternately sourced from an operating voltage as low as 1 volt with respect to a point of reference potential This alternate operation is accomplished by alternately rendering the two transistors of the differential switching pair conductive; and because of the cascade connection, the output impedances of the differential switching transistors are high.

BRIEF DESCRIPTION OF THE DRAWING

Referring now to the drawing.

DETAILED DESCRIPTION

Figures 1, 2, 3, 4:
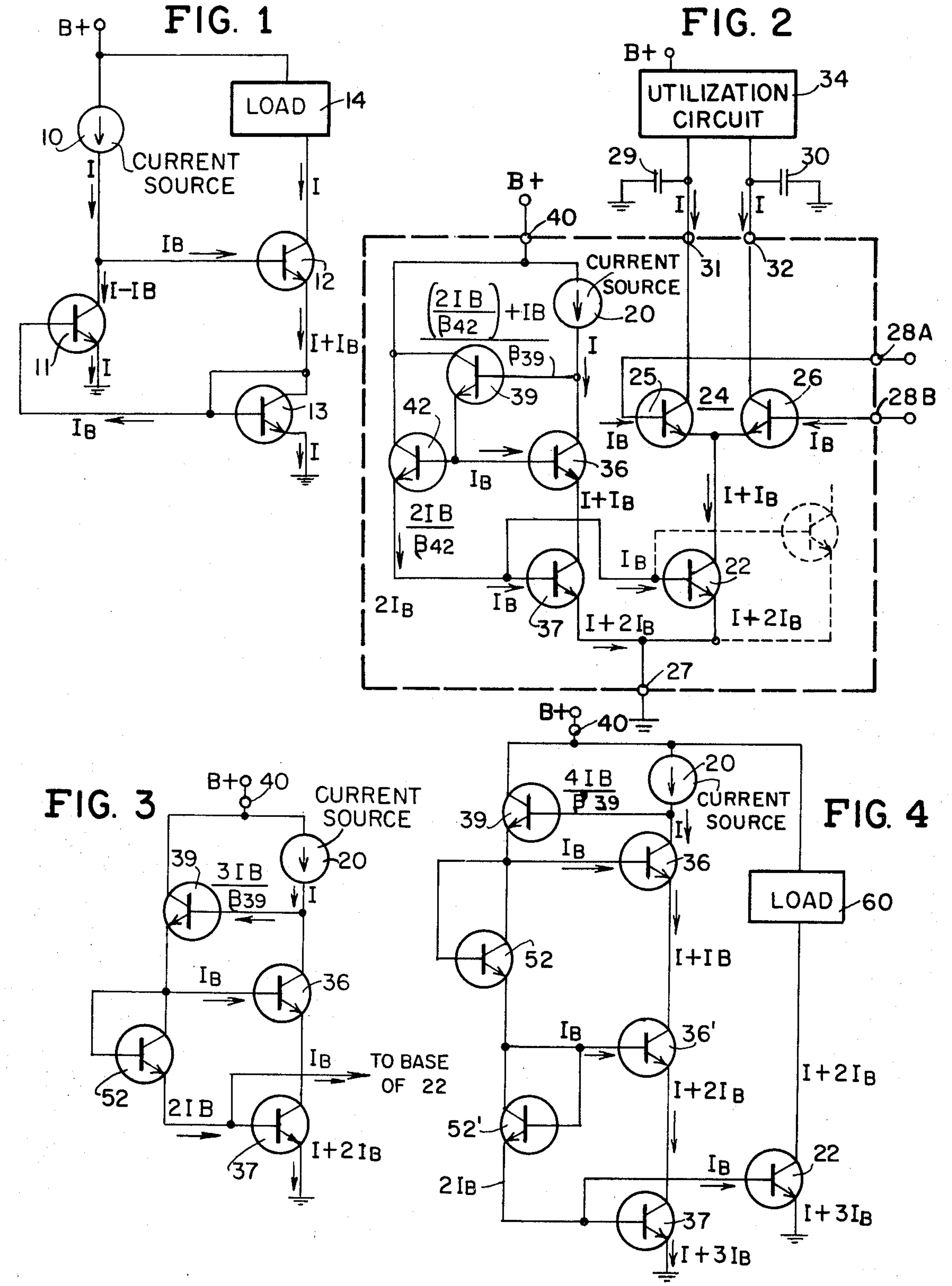
FIG. 1 illustrates a prior art beta cancellation circuit for coupling a current source transistor to a reference current source.
FIG. 2 is a schematic diagram of a preferred embodiment of the invention.
FIGS. 3 and 4 illustrate further embodiments of the invention.

Referring now to FIG. 1, there is shown a portion of a conventional circuit used in monolithic integrated circuits for utilizing a single voltage and temperature stabilized current source 10 to operate as a reference for providing stabilized operating current for other portions of the circuit. In the circuit shown in FIG. 1, the current supplied by a stabilized reference current source 10 is identified as current I and is applied to the collector of an NPN transistor 11, the emitter of which is connected to a point of reference potential, indicated as ground.

The node formed by the interconnection of the collector of the transistor 11 with the current source 10 is connected to the base of an NPN current source transistor 12, the emitter of which is connected through a transistor diode 13 to ground. To complete the circuit and cause cancellation of base current errors from the collector current of the transistor 12, the node at the emitter of the transistor 12 and collector/base of the transistor diode 13 is connected to the base of transistor 11. The transistor 12 then operates to supply operating current I to a suitable load 14. The load 14 may take various forms, such as a differential switch, a differential amplifier, or the like, and is supplied with a source of operating potential indicated as B+ in FIG. 1. This operating potential also is utilized for the current source 10.

The currents flowing in the various branches in the beta cancellation circuit shown in FIG. 1 are indicated in FIG. 1, with the current $I_B$ corresponding to the base current for each of the transistors. An examination of these currents shows that the collector current for the transistor 12 is equal to the current I supplied by the current source 10. For many applications, the circuit shown in FIG. 1 has been found quite adequate. For applications requiring a switching of the current supplied to the load 14 or switching of the current in the load 14 to one or the other of two branches, it is apparent that additional switching components are needed. The addition of such components introduces a beta or base current temperature dependent error to the load current. For example, if a switching transistor is connected in the load 14, an additional base current $I_B$ must be supplied to this transistor, and the collector current of such a switching transistor which then is connected to a suitable utilization circuit within the load is subjected to a temperature dependent error current $I_B$ even though the transistor 12 supplies a beta or temperature independent current I to the emitter of such a switching transistor.

Since the base of the transistor 12 is not free but must be connected at the node of the collector of the transistor 11 with the current source 10, the transistor 12 cannot be used as a switching or toggle transistor. As a result, if it is desired to switch current I to the load 14 without introducing an $I_B$ current component, the switching must take place between the current source 10 and the source of B+ potential.

The problem is compounded even more when it becomes necessary to alternately switch identical currents from one path to another, such as is required in fuel injection systems to alternately, accurately and identically discharge a pair of capacitors. To accomplish such a result it would be necessary to duplicate the circuit of FIG. 1 for controlling the discharge of each of the capacitors, with the necessary toggle switching being connected between the current source 10 and the source of B+ for each of the circuits. In order to insure that the currents switched by such an arrangement were identical, it would be necessary to match all of the circuit components of each of the two circuits with the corresponding components of the other. Although this theoretically is possible, as a practical matter it cannot be done to the accuracy required by circuits such as fuel injection systems.

Referring now to FIG. 2, there is shown an embodiment of a current "mirror" circuit for supplying a voltage and temperature stabilized current which is equal to the current obtained from a regulated current source and which eliminates or cancels beta dependent current components from the circuit. In addition, identical temperature-compensated current can be alternately switched from one capacitor to another with excellent linearity and at load voltages extending down to one volt above ground. In the circuit of FIG. 2, the portions enclosed within the dotted lines preferably are included as part of a single monolithic integrated circuit which includes a conventional stabilized reference current source 20 of the type similar to the current source 10 in FIG. 1.

The current source 20 supplies a current I which is temperature and voltage stabilized, and this current comprises the reference current used to establish the current supplied by other current sources to various utilization circuits on the integrated circuit chip. One of these other current sources is a current source transistor 22 which supplies current to a differential switch 24 comprising a pair of NPN transistors 25 and 26, the emitters of which are connected in common to the collector of the current source transistor 22, the emitter of which in turn is connected to a grounded bondingp ad 27. A pair of external capacitors 29 and 30 are coupled through bonding pads 31 and 32, respectively, to the collectors of the transistors 25 and 26, and the transistors are rendered alternately conductive by external switching signals applied to a pair of input bonding pads 28A and 28B. When the transistor 25 is conductive, the transistor 26 is nonconductive, and vice-versa.

The capacitors 29 and 30 are charged by a suitable utilization circuit 34 (which may be a full injection system, for example) from a source of B+ to a predetermined potential in synchronism with the switching signals applied to the pads 28A and 28B. So long as the transistor 25 or 26 which is coupled to the respective capacitor 29 or 30 is nonconductive, the capacitor maintains the charge to which it is charged by the circuit 34. Whenever one of the transistors 25 or 26 conducts, the capacitor to which it is connected discharges at a rate established by the collector current drawn by the transistor 25 or 26. This current preferably is voltage and temperature stabilized in accordance with the reference current I, so that the discharge rate or ramp of discharge of both of the capacitors 29 and 30 is the same, is linear and is independent of variations in supply voltage, temperature and capacitor voltage. To accomplish this, it is necessary to cause the current supplied by the current source transistor 22 to be such that the current drawn by the collectors of the transistors 25 and 26 is equal to the current I supplied by the current source transistor 20 without any beta-dependent current components.

In the circuit of FIG. 2, beta cancellation or compensation is established by an additional NPN transistor 36, the emiter-collector path of which is connected in series between the current source 20 and the collector of a reference transistor 37, the emitter area of which is equal to the emitter area of the transistor 22 to establish the current supplied for the discharge paths of the capacitors 29 and 30. The base current for the transistor 36 is supplied from an additional NPN control transistor 39, the base of which is coupled to the junction of the current source 20 with the collector of the transistor 36, and the emitter of which is connected to the base of the transistor 36. The collector of the transistor 39 is connected to the B+ bonding pad 40 which also supplies operating potential to the current source 20.

As shown in FIG. 2, the base current $I_B$ supplied by the transistor 39 appears on the emitter of the transistor 36 in addition to the regulated current I supplied by the current source 20. The transistor 39 is selected to be a high gain transistor so that the current drawn by the base of the transistor 39 from the current source 20 is insignificant. Thus, substantially all of the current I supplied by the current source 20 is supplied to the collector of the transistor 36.

An additional NPN transistor 42 has its base connected to the emitter of the transistor 39 and its collector connected to the B+ bonding pad 40. The emitter of the transistor 42 is connected to the bases of the transistors 37 and 22 and supplies the base-operating current for these transistors and possibly other current source transistors, indicated in dotted lines, for supplying other loads. Since, in the example under consideration, the transistors 37 and 22 are matched transistors, the base current $I_B$ is drawn by each of these transistors, so that the emitter of the transistor 42 must supply a current of $2I_B$.

The transistor 42 also is a high gain transistor. The current which is supplied to the base thereof from the emitter of the transistor 39 is equal to $2I_B$ divided by the beta (B) of the transistor 42. Thus, the total current drawn by the base of the transistor 39 is equal to:

$$\frac{\frac{(2I_B)}{(B_{42})}+I_B}{B_{39}}$$

where $B_{42}$ is the beta of the transistor 42 and $B_{39}$ is the beta of the transistor 39.

The emitter current of the transistor 37 is equal to $I+2I_B$ (the sum of its collector and base currents), so that the emitter current of the transistor 22 also is $I+2I_B$. Since the emitter current of the transistor 22 includes the current $I_B$ supplied to its base from the transistor 42, the collector current of the transistor 22 is $I+I_B$, as contrasted with the collector current I of the transistor 12 is shown in FIG. 1. The reason for this increased collector current of the transistor 22 is attributed to two factors. First, the base currents supplied to the transistors 37 and 22 no longer are taken from the regulated current I obtained from the current source 20. Instead, these base currents are supplied by the transistor 42 in the Darlington amplifier comprised of the transistors 39 and 42 from the supply voltage.

The additional component $I_B$ which is added to the collector current of the transistor 22, however, is necessary to compensate for the base current of the switching transistors 25 and 26. Whenever one or the other of these transistors is rendered conductive, a current $I_B$ flows in the base-emitter circuit of the transistor 25 or

26 which is conductive and is added to the collector current of these transistors to form a composite emitter current. Thus, the emitter current of the conductive one of the transistors 25 and 26 is $I+I_B$ as established by the current source transistor 22. The current component $I_B$, however, is supplied from the external circuit used to selectively switch the transistors 25 and 26 into conduction; so that the collector current of the conductive one of the transistors 25 or 26 is equal to the current I supplied by the current source 20. This current is independent of base (beta) current components and therefore is independent of variations with ambient temperature to the same extent that the current source 20 is independent of such variations.

The circuit shown in FIG. 2 permits cancellation of beta-dependent temperature variable current components from the mirror current supplied by the transistor 22 to the discharge current paths for the capacitors 29 and 30 in a circuit where the capacitors ramp down to a low voltage, of the order of one volt. With a potential of one volt appearing on the collectors of the transistors 25 or 26, it is apparent that the voltage on the collector of the transistor 22 can be only about six-tenths or seven-tenths of a volt when the capacitors 29 or 30 are nearly fully discharged. The same current I is pulled out of whichever one of the capacitors 29 or 30 is being discharged by the differential switch 24 since the current is established by the collector current of the transistor 22 for both discharge paths.

Referring now to FIG. 3, there is shown a variation of the beta compensation circuit shown in FIG. 2 which may be substituted for the circuit of FIG. 2, if desired. In the circuit shown in FIG. 3, the components which are the same as the components shown in FIG. 2 are designated with the same reference numbers. In the circuit of FIG. 3, however, the transistor 42 has been replaced with a transistor diode 52, the collector and base of which both are connected to the emitter of the transistor 39. The emitter of the transistor 52 then supplies the base currents to the transistors 37 and 22.

The operation of the circuit of FIG. 3 is substantially the same as the circuit of FIG. 2 except that the base current drawn by the transistor 39 from the current source 20 is equal to $$\frac{3I_B}{B_{39}}$$

in place of the smaller base current drawn by the transistor 39 in the embodiment shown in FIG. 2 due to the loss of the gain of the transistor 42. If the transistor 39, however, is a high gain transistor, the amount of current drawn by the base of the transistor 39 from the current source 20 still is insignificant.

In FIG. 4 there is shown a variation of the circuit shown in FIGS. 2 and 3 which may be employed to add additional base current dependent components to the collector current of the current source transistor 22. Such additional components may be necessary, for example, if the collectors of each of the switching transistors 25 and 26 are connected to the emitters of a pair of transistors in a further differential switch in which it is desired to have the output or collector currents be equal to the current I supplied by the current source 20 without introducing additional base current errors.

In FIG. 4 the components which are the same as the components shown in FIG. 3 are provided with the same reference numbers. The transistor 36, however, in FIG. 4 has been supplemented by an additional transistor 36', which is an NPN transistor having the collector-emitter circuit path connected in series with the collector-emitter circuit path of the transistor 36 between the current source 20 and the collector of the transistor 37. The transistor 36' is utilized to supply an additional base current component $I_B$ to the collector of the transistor 37, with this base current component being obtained from the emitter of the transistor 39 and supplied through the transistor diode 52. An additional transistor diode 52' is connected to the emitter of the transistor diode 52 to supply the base currents to the transistors 37 and 22.

The currents at the various portions of the circuits are shown on the drawing in FIG. 4 and result in a current of $I+2I_B$ on the collector of the transistor 22 connected to a load or utilization circuit 60. If even more base current components must be added to the collector current of the transistor 22 because of the nature of the load 60, cascading of additional transistors 36 and transistor diodes 52 can be employed, with each transistor 36, 36', etc. in the cascade adding an additional base current component $I_B$ to the collector current of the transistor 22.

It should be noted that each transistor added in this manner to the circuit shown in FIG. 4 causes the base current drawn by the transistor 39 to increase by an amount directly proportional to the added base current $I_B$. If the current drawn by the transistor 39 should become high enough to cause an undesirable reduction in the current I supplied by the current source 20, the configuration of FIG. 2 should be employed, with cascading of additional transistors 42 being used to supply the additional base current to the transistors 36. The emitter of each cascaded transistor 42 then would be connected to the base of the next succeeding transistor 42 in the cascade and to the base of the next succeeding transistor 36. The collectors of all of the transistors 42 in such a circuit, however, would be connected to the B+ bonding pad 40.

I claim:

1. A circuit capable of providing a temperature stable output current corresponding to a reference current including in combination:

- a reference current source;
- first and second direct current voltage supply terminals;
- at least one first transistor having collector, base, and emitter electrodes;
- a second transistor having collector, base, and emitter electrodes and of the same conductivity type as said first transistor;
- means coupling the collector-emitter circuits of said first and second transistors in series circuit, in the order named, between said reference current source and said second supply terminal;
- at least one third transistor with collector, base and emitter electrodes;
- means coupling the base of said third transistor with said current source;
- means coupling the collector-emitter circuit of said third transistor between said first voltage supply terminal and the base of said first transistor;
- at least one fourth transistor with collector, base, and emitter electrodes;
- transistor means coupling the emitter of said third transistor with the bases of said second and fourth transistors to supply base current thereto for rendering said second and fourth transistors conductive;
- first means coupling the emitter of said fourth transistor with said second voltage supply terminal; and
- second means coupling the collector of said fourth transistor with a current utilization circuit.

2. The combination according to claim 1 wherein all of said transistors are of the same conductivity type and are formed as part of a single monolithic integrated circuit.

3. The combination according to claim 1 wherein said transistor means comprises a fifth transistor having collector, base and emitter electrodes, with the emtter thereof connected to the bases of said second and fourth transistors, the base thereof connected to the emitter of said third transistor, and the collectors thereof connected first voltage supply terminal.

4. The combination according to claim 3 wherein the collectors of said third and fifth transistors are each coupled with said first voltage supply terminal and the emitter of said third transistor is coupled with the base of said first transistor.

5. The combination according to claim 1 including a plurality of first and third transistors, the third transistors being connected in cascade, with the emitter of each third transistor in the cascade except the last being connected to the base of the next succeeding third transistor and to the base of a corresponding first transistor, the emitter of the last of said third transistors being connected with the bases of said second and fourth transistors, each of said first transistors having the collector-emitter circuit thereof connected in series circuit between said reference current source and the collector of said second transistor.

6. The combination according to claim 1 wherein said transistor means comprises a fifth transistor having collector, base and emitter electrodes, the base and collector of which are coupled with the emitter of said third transistor, and the emitter of which is coupled with the bases of said second and fourth transistors.

7. The combination according to claim 6 wherein said first, second, third, fourth and fifth transistors all are formed as part of the same monolithic integrated circuit, with the betas of said first, second and fourth transistors establishing a current in the collector of said fourth transistor equal to the current from said reference current source modified by a predetermined beta-dependent current.

8. The combination according to claim 1 wherein said second coupling means includes at least one switching transistor having collector, base, and emitter electrodes, with the collector-emitter circuit thereof connected in series between the collector of said fourth transistor and the current utilization circuit and the base thereof adapted for connection with a source of base current.

9. The combination according to claim 1 wherein said second coupling means includes a pair of switching transistors, each having collector, base and emitter electrodes and interconnected as a differential switch, with the emitters thereof connected in common to the collector of said fourth transistor, the collectors thereof each coupled with a different current utilization circuit, and the bases thereof being adapted for connection with a source of base circuit.

10. A circuit capable of providing a temperature stable output current corresponding to a reference current including in combination:

- a reference current source;
- first and second direct current voltage supply terminals;
- at least one first transistor having collector, base, and emitter electrodes;
- a second transistor having collector, base, and emitter electrodes and of the same conductivity type as the first transistor;
- means coupling the collector-emitter electrodes of said first and second transistors in series circuit, in the order named, between said reference current source and said second supply terminal;
- a third transistor of the same conductivity type as said first and second transistors and having collector, base, and emitter electrodes, the base of said third transistor coupled with said current source, the collector of said third transistor coupled with said first voltage supply terminal, and the emitter of said third transistor coupled with the base of said first transistor;
- a fourth transistor with collector, base, and emitter electrodes, the emitter thereof connected with said second voltage supply terminal;
- a fifth transistor with collector, base, and emitter electrodes, with the emitter thereof connected to the bases of said second and fourth transistors, the base thereof connected to the emitter of said third transistor, and the collector thereof connected with said first voltage supply terminal; and sixth and seventh transistors of the same conductivity type as said first and second transistors and each having collector, base and emitter electrodes, said sixth and seventh transistors interconnected as a differential switch, with the emitters thereof connected in common to the collector of said fourth transistor, the collectors thereof each coupled with a different current utilization circuit, and the bases thereof each being adapted for alternate connection with a source of base current.

References Cited

UNITED STATES PATENTS

| | | | |
|---|---|---|---|
| 3,588,672 | 6/1971 | Wilson | 323—4 |
| 3,681,623 | 8/1972 | Hoffman, Jr. et al. | 307—297 |
| 3,683,270 | 8/1972 | Mattis | 323—4 |

GERALD GOLDBERG, Primary Examiner

U.S. Cl. X.R.

307—297, 303; 323—22 T, 9